US012105170B2

(12) United States Patent
Gao et al.

(10) Patent No.: US 12,105,170 B2
(45) Date of Patent: Oct. 1, 2024

(54) MAGNETIC RESONANCE IMAGING SYSTEM AND METHOD, AND COMPUTER-READABLE STORAGE MEDIUM

(71) Applicant: GE Precision Healthcare LLC, Wauwatosa, WI (US)

(72) Inventors: Lei Gao, Beijing (CN); Yongchuan Lai, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 72 days.

(21) Appl. No.: 17/989,315

(22) Filed: Nov. 17, 2022

(65) Prior Publication Data

US 2023/0168324 A1    Jun. 1, 2023

(30) Foreign Application Priority Data

Nov. 30, 2021    (CN) .......................... 202111448883.9

(51) Int. Cl.
  *G01V 3/00*    (2006.01)
  *G01R 33/385*    (2006.01)
  *G01R 33/48*    (2006.01)

(52) U.S. Cl.
  CPC ....... *G01R 33/4818* (2013.01); *G01R 33/385* (2013.01)

(58) Field of Classification Search
  CPC .............. G01R 33/3415; G01R 33/543; G01R 33/5659; G01R 33/36; A61B 5/055
  USPC ....................................................... 324/309
  See application file for complete search history.

(56) References Cited

U.S. PATENT DOCUMENTS

| 11,119,175 B2 | 9/2021 | Gao | |
|---|---|---|---|
| 2010/0037182 A1* | 2/2010 | Biglieri | G01R 33/54 324/309 |
| 2011/0112393 A1* | 5/2011 | Taniguchi | A61B 5/055 600/410 |

(Continued)

OTHER PUBLICATIONS

Chen et al., "A robust multi-shot scan strategy for high-resolution diffusion weighted MRI enabled by multiplexed sensitivity-encoding (MUSE)", (2013), NeuroImage, 72, 41-47, 15 pages.

*Primary Examiner* — Walter L Lindsay, Jr.
*Assistant Examiner* — Frederick Wenderoth

(57) ABSTRACT

A magnetic resonance imaging method, a magnetic resonance imaging system, and a computer-readable storage medium are provided. The magnetic resonance imaging method comprises: acquiring a plurality of portions of a k-space by using a plurality of sets of imaging sequences to obtain a plurality of k-space data sets, each set of imaging sequences comprising a pre-dephasing gradient pulse and a plurality of phase encoding gradients applied after the pre-dephasing gradient pulse, wherein the pre-dephasing gradient pulses in the plurality of sets of imaging sequences have a standard area difference in order when sorted according to the sizes of area values, and the standard area difference is 2/N of the area of any phase encoding gradient, where N is the number of sets of the plurality of sets of imaging sequences; respectively reconstructing a magnetic resonance image from each of the plurality of k-space data sets; and processing the plurality of k-space data sets to obtain a magnetic resonance image.

11 Claims, 8 Drawing Sheets

(56) References Cited

U.S. PATENT DOCUMENTS

| | | | |
|---|---|---|---|
| 2013/0271128 A1* | 10/2013 | Duerk | G01R 33/5614 |
| | | | 324/307 |
| 2016/0003928 A1* | 1/2016 | Chen | G01R 33/5618 |
| | | | 324/309 |
| 2018/0120403 A1* | 5/2018 | Liu | G01R 33/56341 |
| 2018/0188343 A1* | 7/2018 | Liu | A61B 5/055 |
| 2019/0033417 A1* | 1/2019 | Yang | G01R 33/246 |

* cited by examiner

MAGNETIC RESONANCE IMAGING SYSTEM AND METHOD, AND COMPUTER-READABLE STORAGE MEDIUM

CROSS REFERENCE

The present application claims priority and benefit of Chinese Patent Application No. 202111448883.9 filed on Nov. 30, 2021, which is incorporated herein by reference in its entirety.

TECHNICAL FIELD

The present invention relates to the field of medical imaging, and in particular to a magnetic resonance imaging (MRI) system and method and a computer-readable storage medium.

BACKGROUND

Conventional magnetic resonance echo plane imaging (EPI) is a fast imaging technology in which an entire image can be formed from a plurality of echo signals generated by a single radio-frequency (RF) excitation, thus enabling fast imaging. However, this imaging technology is prone to Nyquist artifacts, which can be caused by factors such as eddy currents, gradient coil heating, gradient delays, etc. In addition, since an acceleration technique of parallel imaging is usually implemented at the same time in EPI, acceleration artifacts appear in edge regions of images.

Some methods for suppressing Nyquist artifacts or acceleration artifacts have been proposed in the prior art, but it is difficult to suppress these two different types of artifacts at the same time, and the effects of suppressing the artifacts need to be further improved.

For example, in order to resolve the issues of phase variation and parallel acceleration artifacts between a plurality of acquisitions, a MUSE (multiplexed sensitivity-encoding) method is proposed; however, it is still difficult for the MUSE method to eliminate Nyquist artifacts in images.

SUMMARY

One aspect of the present invention provides a magnetic resonance imaging method, which is capable of eliminating Nyquist artifacts in magnetic resonance imaging. The method includes: acquiring a plurality of portions of a k-space by using a plurality of sets of imaging sequences to obtain a plurality of k-space data sets, each set of imaging sequences including a pre-dephasing gradient pulse and a plurality of phase encoding gradients applied after the pre-dephasing gradient pulse, where the pre-dephasing gradient pulses in the plurality of sets of imaging sequences have a standard area difference in order when sorted according to the sizes of area values, and the standard area difference is 2/N of the area of any phase encoding gradient, where N is the number of sets of the plurality of sets of imaging sequences; and processing the plurality of k-space data sets to obtain a magnetic resonance image.

In another aspect, the number of sets of the plurality of sets of imaging sequences is greater than two.

In another aspect, the step of processing the plurality of k-space data sets includes processing the plurality of k-space data sets on the basis of a multiplexed sensitivity encoding algorithm.

In another aspect, the step of processing the plurality of k-space data sets includes: separately de-accelerating the plurality of k-space data sets to obtain a plurality of phase maps; obtaining a corrected coil sensitivity map on the basis of the plurality of phase maps; and obtaining the magnetic resonance image on the basis of the corrected coil sensitivity map and the plurality of k-space data sets.

In another aspect, each set of imaging sequences further includes a radio-frequency excitation pulse, a radio-frequency refocusing pulse, and a diffusion gradient pulse, the diffusion gradient pulse includes a phase shifting gradient pulse and a re-phasing gradient pulse, the phase shifting gradient pulse and the re-phasing gradient pulse are applied symmetrically before and after the radio-frequency refocusing pulse respectively, and the pre-dephasing gradient pulse is applied after the re-phasing gradient pulse.

Another aspect of the present invention further provides a magnetic resonance imaging method, including: acquiring a plurality of portions of a k-space by using a plurality of sets of imaging sequences to obtain a plurality of k-space data sets, each set of imaging sequences including an echo-planar imaging sequence and a preparation sequence applied before the echo-planar imaging sequence, where echoes of the plurality of k-space data sets have a standard phase offset in order when sorted according to phase values, and the standard phase offset is $2\pi/N$, where N is the number of the k-space data sets; and processing the plurality of k-space data sets to obtain a magnetic resonance image.

In another aspect, the number of the k-space data sets is greater than 2.

In another aspect, the preparation sequence includes a spin echo sequence, a gradient echo sequence, a diffusion weighting sequence, or a spin echo-diffusion weighting sequence.

Another aspect of the present invention further provides a computer-readable storage medium, the computer-readable storage medium including a stored computer program, where the magnetic resonance imaging method according to any one of the above aspects is performed when the computer program is run.

Another aspect of the present invention further provides a magnetic resonance imaging system, including: a gradient coil, configured to generate an encoding gradient; a radio-frequency (RF) coil, configured to generate an RF pulse; and a processor connected to the gradient coil and the RF coil. The processor is configured to: instruct the gradient coil and the RF coil to generate a plurality of sets of imaging sequences to acquire a plurality of portions of a k-space and obtain a plurality of k-space data sets, each set of imaging sequences including a pre-dephasing gradient pulse and a plurality of phase encoding gradients applied after the pre-dephasing gradient pulse, where the pre-dephasing gradient pulses in the plurality of sets of imaging sequences have a standard area difference in order when sorted according to the sizes of area values, and the standard area difference is 2/N of the area of any phase encoding gradient, where N is the number of sets of the plurality of sets of imaging sequences. The processor is further configured to obtain a magnetic resonance image on the basis of the plurality of k-space data sets.

It should be understood that the brief description above is provided to introduce, in simplified form, some concepts that will be further described in the detailed description. The brief description above is not meant to identify key or essential features of the claimed subject matter. The scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where.

Figure 1:
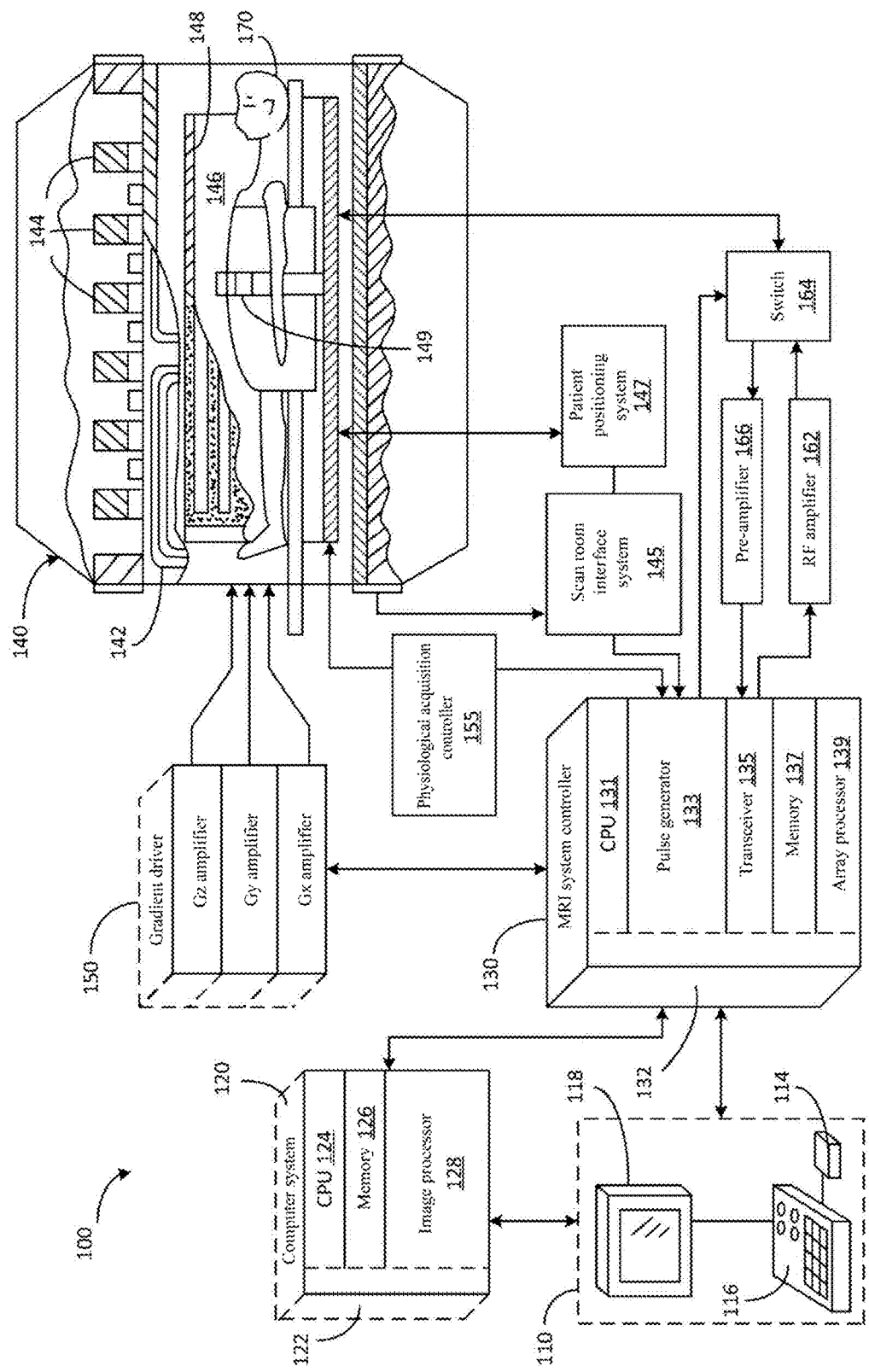
FIG. 1 is a schematic diagram of a magnetic resonance imaging (MRI) system according to an exemplary embodiment.

The drawings illustrate the described components, systems, and methods of magnetic resonance imaging methods and systems. Together with the following description, the drawings illustrate and explain the structural principles, methods, and principles described herein. In the drawings, the thicknesses and dimensions of components may be exaggerated or otherwise modified for clarity. Well-known structures, materials, or operations are not shown or described in detail to avoid obscuring the described components, systems, and methods.

DETAILED DESCRIPTION

Specific implementations of the present invention will be described below. It should be noted that in the specific description of these embodiments, for the sake of brevity and conciseness, this specification may not describe all features of the actual implementations in detail. It should be understood that in the actual implementation process of any implementations, just as in the process of any engineering project or design project, a variety of specific decisions are often made to achieve specific goals of the developer and to meet system-related or business-related constraints, which may also vary from one implementation to another. Furthermore, it should also be understood that although efforts made in such development processes may be complex and tedious, for those of ordinary skill in the art related to the content disclosed in the present invention, some design, manufacture or production changes based on the technical content disclosed in the present disclosure are only common technical means, and should not be construed as insufficient content of the present disclosure.

Unless otherwise defined, the technical or scientific terms used in the claims and the description are as they are usually understood by those of ordinary skill in the art to which the present invention pertains. Terms such as "first," "second," and similar terms used in this specification and claims do not denote any order, quantity, or importance, but are only intended to distinguish different constituents. The terms "one" or "a/an" and similar terms do not denote a limitation of quantity, but rather the presence of at least one. The terms "include" or "comprise" and similar terms mean that an element or article preceding the term "include" or "comprise" encompasses elements or articles and their equivalent elements listed after "include" or "comprise," and does not exclude other elements or articles. The terms "connect" or "connected" and similar words are not limited to physical or mechanical connections, and are not limited to direct or indirect connections. Furthermore, it should be understood that references to "one embodiment" or "an embodiment" of the present disclosure are not intended to be interpreted as excluding the existence of additional embodiments that also incorporate the features referred to.

With reference to the drawings, the present disclosure describes a magnetic resonance system and a magnetic resonance imaging method capable of suppressing Nyquist artifacts and acceleration artifacts. A plurality of portions of a k-space are acquired by using a plurality of sets of imaging sequences to obtain a plurality of k-space data sets, and image reconstruction is performed on the plurality of k-space data sets to generate a magnetic resonance image. Each set of imaging sequences above includes a pre-dephasing gradient pulse and a plurality of phase encoding gradients applied after the pre-dephasing gradient pulse, where the pre-dephasing gradient pulses in the plurality of sets of imaging sequences have a standard area difference in order when sorted according to the sizes of area values, and the standard area difference is 2/N of the area of any phase encoding gradient, where N is the number of sets of the plurality of sets of imaging sequences. In this way, artifacts in echoes of the plurality of sets of imaging pulse sequences are attenuated, so that both Nyquist artifacts and acceleration artifacts are suppressed in the resulting MR image.

Referring to FIG. 1, a schematic diagram of an exemplary MRI (magnetic resonance imaging) system 100 according to some embodiments is shown. Operation of the MRI system 100 is controlled by an operator workstation 110. The operator workstation 110 includes an input device 114, a control panel 116, and a display 118. The input device 114 may be a joystick, a keyboard, a mouse, a trackball, a touch-activated screen, a voice control, or any similar or equivalent input device. The control panel 116 may include a keyboard, a touch-activated screen, a voice control, a button, a slider, or any similar or equivalent control device. The operator workstation 110 is coupled to and in communication with a computer system 120 that enables an operator to control generation and display of images on the display 118. The computer system 120 includes various components that communicate with each other via an electrical and/or data connection module 122. The connection module 122 may be a direct wired connection, a fiber optic connection, a wireless communication link, etc. The computer system 120 may include a central processing unit (CPU) 124, a memory 126, and an image processor 128. In some embodiments, the image processor 128 may be replaced by image processing functions implemented in a CPU 124. The computer system 120 may be connected to an archival media device, a persistent or backup storage, or a network. The computer system 120 may be coupled to and in communication with a separate MRI system controller 130.

The MRI system controller 130 includes a set of components that communicate with each other via an electrical and/or data connection module 132. The connection module 132 may be a direct wired connection, a fiber optic connection, a wireless communication link, etc. The MM system controller 130 may include a CPU 131, a sequence pulse generator 133 in communication with the operator workstation 110, a transceiver (or an RF transceiver) 135, a memory 137, and an array processor 139. In some embodiments, the sequence pulse generator 133 may be integrated into a resonance assembly 140 of the MRI system 100. The MRI system controller 130 may receive commands from the operator workstation 110 to indicate an MRI scan sequence to be executed during an MM scan. The MM system controller 130 is further coupled to and in communication with a gradient driver system 150, which is coupled to a gradient coil assembly 142 to generate a magnetic field gradient during the MRI scan.

The sequence pulse generator 133 may further receive data from a physiological acquisition controller 155, which receives signals from a number of different sensors, such as electrocardiogram (ECG) signals from electrodes attached to a patient, which are connected to the subject or patient 170 undergoing an MRI scan. The sequence pulse generator 133 is coupled to and in communication with a scan room interface system 145 that receives signals from various sensors associated with the state of the resonance assembly 140. The scan room interface system 145 is further coupled to and in communication with a patient positioning system 147 that sends and receives signals to control movement of a patient table to a desired position to perform the MRI scan.

The MRI system controller 130 provides gradient waveforms to the gradient driver system 150, which includes $G_x$, $G_y$, and $G_z$ amplifiers, etc. Each of the $G_x$, $G_y$, and $G_z$ gradient amplifiers excites a corresponding gradient coil in the gradient coil assembly 142 so as to generate a magnetic field gradient used to spatially encode an MR signal during the MRI scan. The gradient coil assembly 142 is disposed within the resonance assembly 140, and the resonance assembly further includes a superconducting magnet having a superconducting coil 144 that, in operation, provides a static uniform longitudinal magnetic field $B_0$ throughout a cylindrical imaging volume 146" The resonance assembly 140 further includes an RF body coil 148 that, in operation, provides a transverse magnetic field $B_1$ that is approximately perpendicular to $B_0$ throughout the cylindrical imaging volume 146. The resonance assembly 140 may further include an RF surface coil 149, which is used to image different anatomical structures of a patient undergoing the MRI scan. The RF body coil 148 and the RF surface coil 149 may be configured to operate in a transmit and receive mode, a transmit mode, or a receive mode.

The subject or patient 170 of the MRI scan may be positioned within the cylindrical imaging volume 146 of the resonance assembly 140. A transceiver 135 in the MRI system controller 130 generates RF excitation pulses that are amplified by an RF amplifier 162 and provided to the RF body coil 148 through a transmit/receive switch (T/R switch) 164.

As described above, the RF body coil 148 and the RF surface coil 149 may be used to transmit RF excitation pulses and/or receive resulting MR signals from the patient undergoing the MRI scan. The MR signals emitted by excited nuclei in the patient of the MRI scan may be sensed and received by the RF body coil 148 or the RF surface coil 149 and sent back to a pre-amplifier 166 through the T/R switch 164. The T/R switch 164 may be controlled by a signal from the sequence pulse generator 133 to electrically connect the RF amplifier 162 to the RF body coil 148 in the transmit mode and to connect the pre-amplifier 166 to the RF body coil 148 in the receive mode. The T/R switch 164 may further enable the RF surface coil 149 to be used in the transmit mode or the receive mode.

In some embodiments, the MR signals sensed and received by the RF body coil 148 or the RF surface coil 149 and amplified by the pre-amplifier 166 are stored in a memory 137 for post-processing as a raw k-space data array. A reconstructed magnetic resonance image may be obtained by transforming/processing the stored raw k-space data.

In some embodiments, the MR signals sensed and received by the RF body coil 148 or the RF surface coil 149 and amplified by the pre-amplifier 166 are demodulated, filtered, and digitized in a receiving portion of transceiver 135, and transmitted to the memory 137 in the MRI system controller 130. For each image to be reconstructed, the data is rearranged into separate k-space data arrays, and each of these separate k-space data arrays is input to the array processor 139, which is operated to convert the data into an array of image data by Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term storage, or may be further processed by the image processor 128 and transmitted to the operator workstation 110 for presentation on the display 118.

In various embodiments, components of the computer system 120 and the MRI system controller 130 may be implemented on the same computer system or on a plurality of computer systems. It should be understood that the MM system 100 shown in FIG. 1 is intended for illustration. Suitable MM systems may include more, fewer, and/or different components.

The MRI system controller 130 and the image processor 128 may separately or collectively include a computer processor and a storage medium. The storage medium records a predetermined data processing program to be executed by the computer processor. For example, the storage medium may store a program used to implement scanning processing (such as a scan flow and an imaging sequence), image reconstruction, image processing, etc. For example, the storage medium may store a program used to implement the magnetic resonance imaging method according to the embodiments of the present invention. The storage medium may include, for example, a ROM, a floppy disk, a hard disk, an optical disk, a magneto-optical disk, a CD-ROM, or a non-volatile memory card.

The aforementioned "imaging sequence" refers to a combination of pulses having specific amplitudes, widths, directions, and time sequences and applied when a magnetic resonance imaging scan is executed. The pulses may typically include, for example, a radio-frequency pulse and a gradient pulse. The radio-frequency pulses may include, for example, radio-frequency excitation pulses, radio-frequency refocus pulses, inverse recovery pulses, etc. The gradient pulses may include, for example, the aforementioned gradient pulse used for layer selection, gradient pulse used for phase encoding, gradient pulse used for frequency encoding, gradient pulse used for phase shifting (phase shift), gradient pulse used for dispersion of phases (dephasing), etc.

Typically, a plurality of scanning sequences can be pre-set in the magnetic resonance system, so that the sequence suitable for clinical detection requirements can be selected.

The clinical detection requirements may include, for example, an imaging site, an imaging function, an imaging effect, and the like.

For example, a magnetic resonance imaging sequence capable of simultaneously suppressing Nyquist artifacts and acceleration artifacts in the embodiments of the present invention may be preset, and the imaging sequence may include a preparation sequence and an echo-planar imaging (EPI) sequence, where the preparation sequence is applied before the EPI sequence. Conventional EPI is an accelerated imaging technique in which an entire image can be formed from a plurality of echo signals generated by a single radio-frequency (RF) excitation. In a k-space, one echo is generated along each phase line in the k-space. In k-space acquisition, two adjacent echoes are acquired in opposite directions, such as a forward echo and a reverse echo. Eddy currents due to rapid gradient changes, gradient coil heating, gradient system delays, etc. all have the potential to prevent forward and backward echoes from producing perfect mirror images of each other and thus introduce artifacts into an image during reconstruction. For example, a delay from the start of the first echo will propagate to all subsequent echoes, resulting in a timing difference between the peaks of odd and even echoes. When a Fourier transform is performed, this phase error will cause signal intensity to shift in a phase-encoding direction of half the image, which is known as Nyquist ghosting. In addition, since an acceleration technique of parallel imaging is usually implemented at the same time in EPI, parallel acceleration artifacts caused by wrapping appear in edge regions of the image.

In MUSE, multi-shot EPI is adopted instead of traditional single-shot EPI, and thus higher image resolutions are reached. In the multi-shot EPI, trajectory lines for acquisition in a k-space may be shifted sequentially by $$\frac{\pi}{N},$$

where N is the number of EPI executions.

Figure 2:
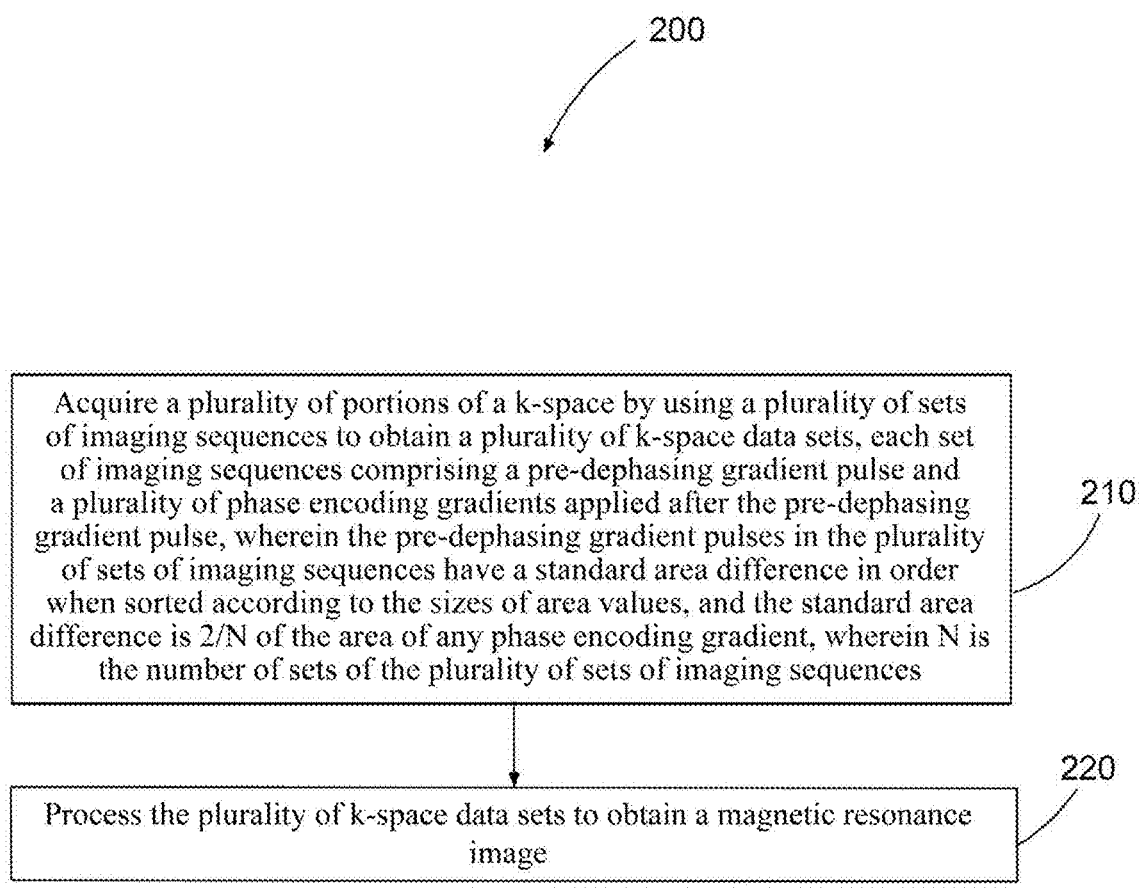
FIG. 2 is a flowchart of a magnetic resonance imaging method according to an exemplary embodiment of the present invention.

Referring to FIG. 2, a flowchart of a magnetic resonance imaging method 200 according to an exemplary embodiment is shown.

In step 210, a plurality of portions of a k-space are acquired by using a plurality of sets of imaging pulse sequences to obtain a plurality of k-space data sets. The plurality of sets of imaging pulse sequences may include multi-shot EPI, and the whole k-space is formed when the plurality of portions of the k-space are combined. For example, when three sets of imaging pulse sequences such as three shots of EPI are used, ⅓ of the entire k-space data is acquired each time.

In step 220, the plurality of k-space data sets are processed to obtain a magnetic resonance image.

Figure 3:
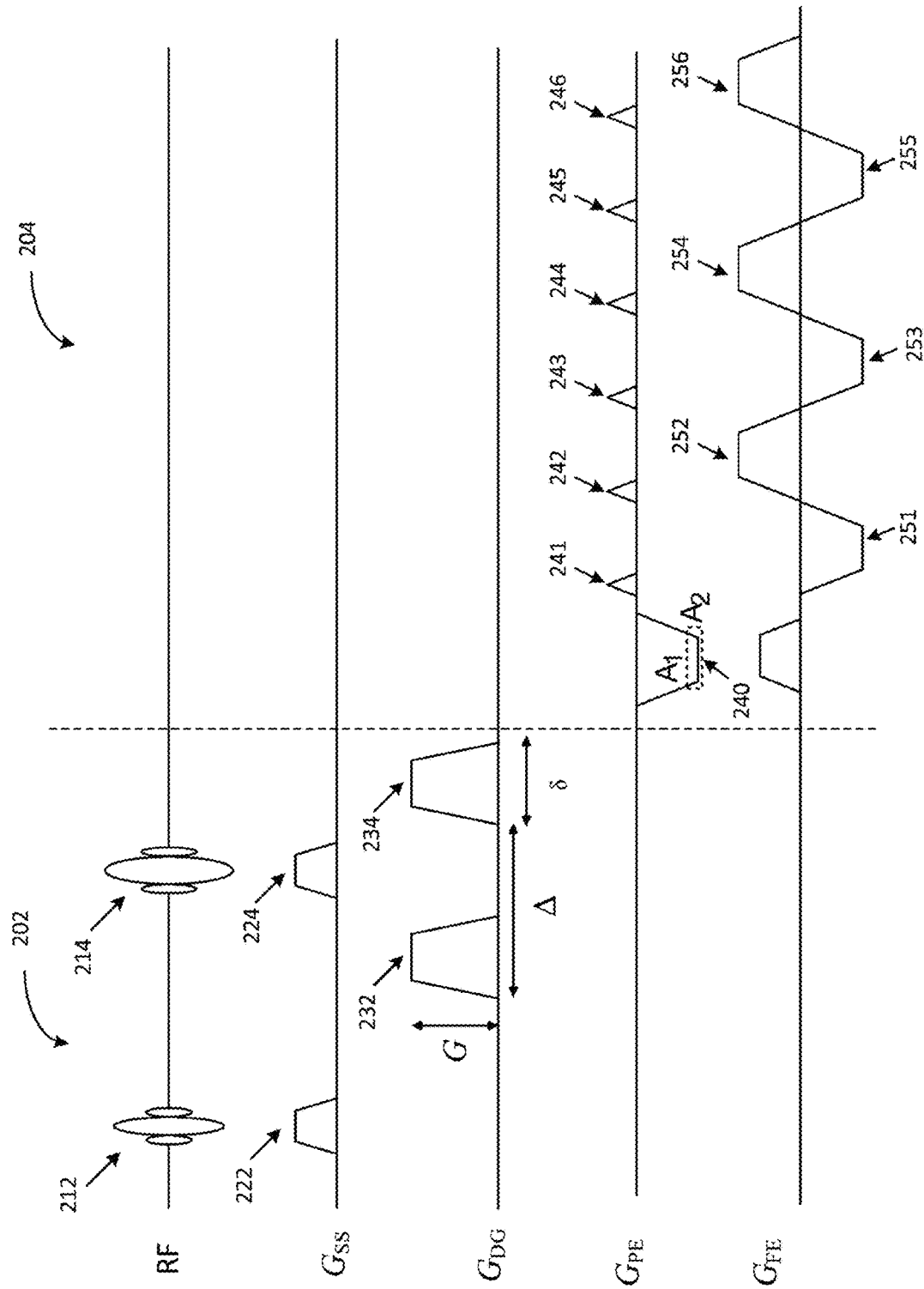
FIG. 3 is a schematic diagram of an exemplary imaging sequence used by the method shown in FIG. 2.

Referring to FIG. 3, a schematic diagram of an exemplary imaging sequence 300 applied in the method 200 is shown. Each set of imaging sequences includes an EPI sequence 204 and a preparation sequence 202 applied before the EPI sequence. As one example, the preparation sequence 202 may include an SE-DWI (spin echo-diffusion weighted) sequence, which may include, for example, a radio-frequency (RF) excitation pulse 212 and a radio-frequency refocusing pulse 214 applied sequentially, and slice selection gradient ($G_{SS}$) pulses 222 and 224 applied along with the radio-frequency excitation pulse 212 and the radio-frequency refocusing pulse 214 respectively.

Further, the preparation sequence 202 may further include a diffusion gradient (GDG) pulse for proton diffusion weighting. Diffusion weighting technology can be applied to the diagnosis of tissue functions in various organs (e.g., brain, cartilage, and liver) and various applications (e.g., pathology and oncology). Diffusion refers to the random movement of molecules in a system. In a biological tissue, the diffusion of water molecules forms a pattern based on the structure and properties of the tissue. In some disease states, the pattern of diffusion may be disturbed, and the amount of diffusion may vary in areas affected by diseases. Therefore, tissue abnormalities can be detected by studying changes in diffusion. Diffusion-weighted magnetic resonance imaging techniques utilize the diffusion of water molecules to visualize internal physiology. The contrast of diffusion-weighted images reflects differences in diffusion rates between tissues. The diffusion weighting techniques are especially useful in cases where conventional MRI sequences (e.g., T2-weighted imaging) do not show significant changes in images. For example, in pathological conditions like stroke produced by ischemia, the signal intensity on T2 does not change until at least 8 hours after stroke onset. In another aspect, DWI can show changes in the brain as early as 30 minutes after stroke onset, and show clear signal differences within one hour of onset.

The diffusion gradient pulse includes a phase shifting gradient pulse 232 and a re-phasing gradient pulse 234, which are applied symmetrically on two sides (before and after) the radio-frequency refocusing pulse 214, respectively.

The aforementioned radio-frequency excitation pulse 212 may be, for example, a 90-degree radio-frequency pulse, and the radio-frequency refocusing pulse 214 may be a 180-degree radio-frequency pulse, both of which may be generated by a transmit coil (e.g., the RF body coil 148 in FIG. 1). In some embodiments, the radio-frequency excitation pulse 212 itself may be selectively tuned to excite only water protons. The slice selection gradient pulses 222 and 224 and the diffusion gradient pulses 232 and 234 can be generated by a gradient coil assembly (e.g., the gradient coil assembly 142 in FIG. 1).

The phase shifting gradient pulse 232 is used to introduce a phase shift into protons according to the positions of the protons, and the re-phasing gradient pulse 234 reverses the above change made by the phase shifting gradient pulse 232. For fixed spins, the phase thereof is not affected by the diffusion gradient pulse, since any phase accumulation from the phase shifting gradient pulse 232 will be inverted by the re-phasing gradient pulse 234. However, the diffusion spins move to different positions between the phase shifting gradient pulse 232 and the re-phasing gradient pulse 234, losing phases and losing signals. That is, if the protons move, the re-phasing gradient pulse 234 will not completely undo the phase shift caused by the phase shifting gradient pulse 232. Therefore, there will be signal attenuation. This signal attenuation from the net motion of protons is given by a Stejskal-Tanner formula:

$$S(b) = S_0 e^{-bD} \tag{1}$$

where S(b) is a signal received when a specific diffusion gradient pulse pair is applied, $S_0$ is signal strength without any diffusion gradient, e is a constant, D is a diffusion or apparent diffusion coefficient (ADC), and b is a diffusion weighting degree used for the specific diffusion gradient pulse pair. The value of b can be controlled by manipulating the intensity, duration, and spacing of the diffusion gradient pulse pair 232 and 234. Specifically, the value of b is given by:

$$b = \gamma^2 G^2 \delta^2 \left(\Delta - \frac{\delta}{3}\right), \quad (2)$$

where $\gamma$ is the gyromagnetic ratio of hydrogen protons, which is a constant, G is the amplitude of the diffusion gradient pulse, $\delta$ is the duration of the diffusion gradient pulse, and $\Delta$ is time between application of two diffusion gradient pulses. In clinical applications, usually sequences are set to provide a plurality of images with diffusion directions and ranges of b-values, and sometimes ADC mappings can be calculated. For example, several DW (diffusion weighted) images with different b-values can be obtained by changing the configuration of diffusion gradient pulse pairs. At higher b-values, effects of diffusion are more pronounced in tissues with high diffusion in the image, as shown by low signal regions in the image, while tissues with restricted diffusion are shown by high signal regions.

Using the SE-DWI sequence as the preparation sequence is merely one example of application, and in other examples, the preparation sequence 202 may be other types of sequences, such as a GRE (gradient echo) sequence, an SE sequence, a DWI sequence, etc.

After the preparation sequence 202 is applied, the EPI sequence 204 may be executed immediately to perform fast acquisition of k-space data. Fast image acquisition can minimize effects of overall motion on the image. The EPI sequence 204 includes a pre-dephasing gradient pulse 240 and a plurality of phase encoding gradient ($G_{PE}$) pulses (241, 242, 243, . . . ) and a plurality of frequency-encoding gradient ($G_{FE}$) pulses (251, 252, 253, . . . ) applied after the pre-dephasing gradient pulse 240. The pre-dephasing gradient pulse 240, the plurality of phase encoding gradient pulses, and the plurality of frequency-encoding gradient pulses may be generated by gradient coils (e.g., the gradient coil assembly 142 in FIG. 1).

As shown in FIG. 3, after the pre-dephasing gradient pulse 240 ends, there are a plurality of small "spikes" at each position where the frequency-encoding gradient pulse is inverted, i.e., the aforementioned plurality of phase encoding gradient pulses. The plurality of phase encoding gradient pulses rapidly oscillate to generate a plurality of gradient echoes. The directions of the plurality of frequency encoding gradient pulses are alternately inverted, and the plurality of phase encoding gradient pulses are respectively applied when the directions of the plurality of frequency encoding gradient pulses are inverted. For example, a spike 241 is applied at the start of a negative frequency encoding (or readout) gradient pulse 251; a spike 242 is placed at the inversion from the negative readout gradient 251 to a positive readout gradient 252, and a spike 243 is placed at the inversion from the positive readout gradient 252 to a negative readout gradient 253, and so on. The spikes are of a constant size, and each adds further phase encoding to previous spikes.

In each set of imaging sequences, the phases of a plurality of corresponding gradient echoes can be controlled by setting the area of the pre-dephasing gradient 240. The areas of the pre-dephasing gradient pulses 240 of the plurality of sets of imaging sequences used in the magnetic resonance imaging method of the embodiments of the present invention are different. Specifically, the pre-dephasing gradient pulses 240 of the plurality of sets of imaging sequences have a standard area difference in order when sorted according to the sizes of area values. The standard area difference is 2/N of the area of any phase encoding gradient (241, 242, 243, . . . ), where N is the number of sets of the plurality of sets of imaging sequences. If the area of the phase encoding gradient pulse is $A_3$, using five sets of imaging sequences as an example, the standard area difference $$A_2 = \frac{2A_3}{5};$$

if the area of a pre-dephasing gradient pulse of the first set of imaging sequences is $A_1$, then the areas of pre-dephasing gradient pulses of the first to fifth sets of imaging sequences are $$A_1 + \frac{2A_3}{5}, A_1 + \frac{4A_3}{5}, A_1 + \frac{6A_3}{5}, \text{ and } A_1 + \frac{8A_3}{5},$$

respectively.

In addition, in the embodiments of the present invention, the execution order of the aforementioned plurality of sets of imaging sequences may be the same as or different from the aforementioned order according to the size of area values. That is, the plurality of sets of imaging sequences may be executed in sequence, where the areas of the pre-dephasing gradient pulses 240 gradually increase or decrease by a fixed value according to the execution order of the sequences; or the plurality of sets of imaging sequences may be sequentially executed, where the area values of the pre-dephasing gradient pulse 240 do not sequentially increase or decrease according to the execution order of the sequences. In this way, the area value of the pre-dephasing gradient pulse 240 is changed in such a way that when a relatively large number of k-space data sets are acquired, both Nyquist artifacts and acceleration artifacts in a final image obtained on the basis of magnetic resonance images of the plurality pieces of k-space data can be better suppressed.

For example, if five sets of imaging sequences are used, and the first set of imaging sequences is shown in FIG. 3 (in FIG. 3, the pre-dephasing gradient pulse 240 has an initial area $A_1$ and a standard area difference $A_2$ is shown using a dashed line), then in the second to fifth sets of imaging sequences, the areas of pre-dephasing gradient pulses may be $A_1+A_2$, $A_1+2A_2$, $A_1+3A_2$, and $A_1+4A_2$, respectively, or may be $A_1-A_2$, $A_1-2A_2$, $A_1-3A_2$, and $A_1-4A_2$, respectively. In the above example, for the first set of imaging sequences, there is a second set of imaging sequences, which has an area difference of $A_2$ or $-A_2$ from a pre-dephasing gradient pulse thereof; for the second set of imaging sequences, there is a third set of imaging sequences, which also has an area difference of $A_2$ or $-A_2$ from the pre-dephasing gradient pulse thereof, and so on. The aforementioned first to fifth imaging sequences are not necessarily executed sequentially in order. For example, the imaging sequences may be executed in an order of the second, fifth, first, fourth, and third imaging sequences, or may be executed in an order of any other combination.

Since the area of the pre-dephasing gradient pulse 240 affects the phases of the plurality of gradient echoes in the corresponding sequence, a k-space phase encoding line is also shifted as a whole.

Figure 4:
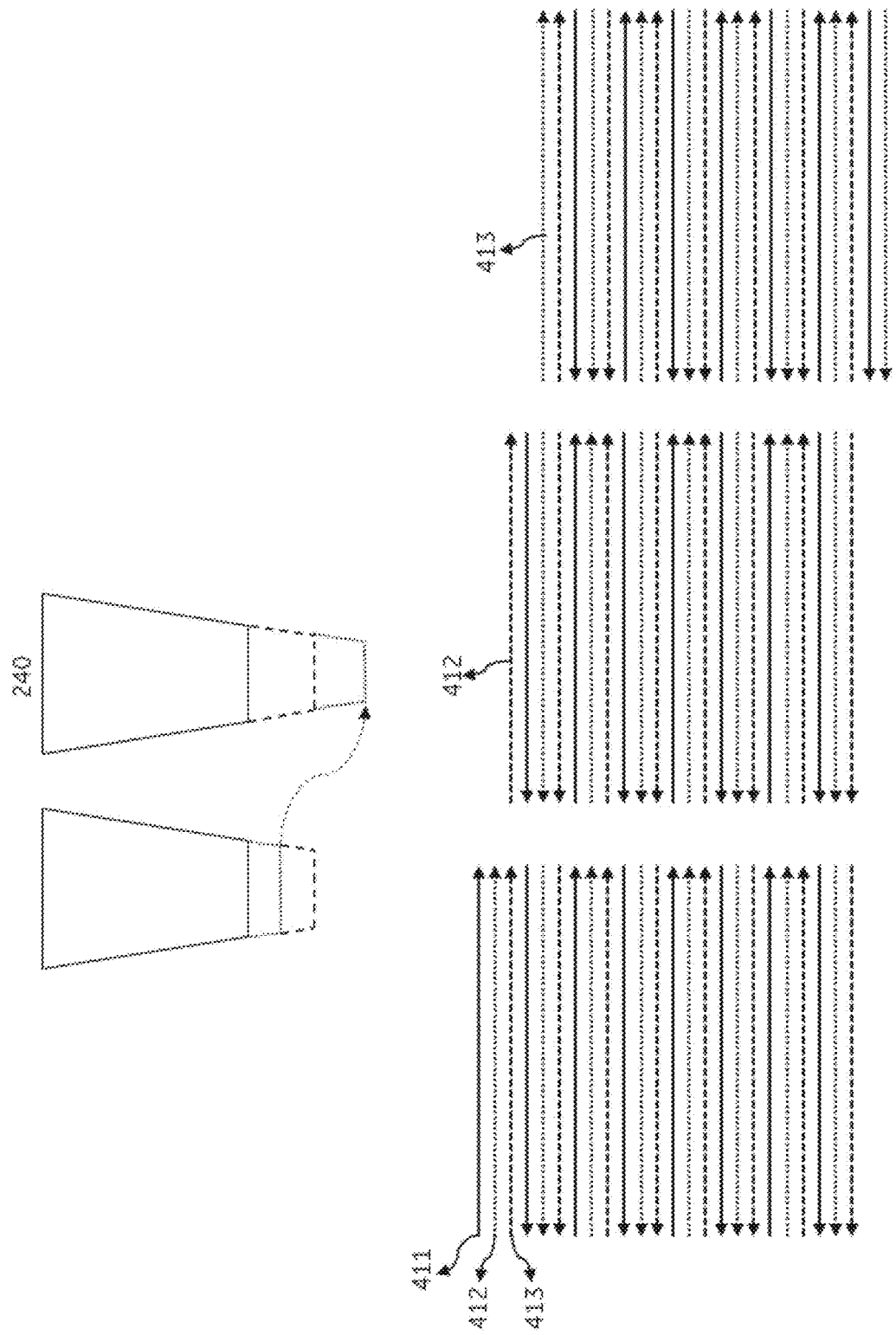
FIG. 4 is a schematic diagram of a k-space data acquisition trajectory line obtained according to an exemplary embodiment of the present invention.

Referring to FIG. 4, an exemplary schematic diagram of a k-space data acquisition trajectory line is shown according to the pulse sequence of FIG. 2. First a k-space data set 411 is acquired along the lowest line in the presence of the frequency-encoding gradient pulse 251. When the spike 242 is applied, a k-space data set 412 is acquired along the second lowest line in the presence of the frequency-encoding gradient pulse gradient 252, and so on. When the spike 242 is applied, more k-space data sets are respectively obtained in the presence of the frequency-encoding gradient pulse gradient 252. Each spike adds constant phase encoding to the previous spikes, forming a regular path through the k-space. The amplitudes of frequency-encoding gradient pulses are typically large, so that suitable values can be sampled quickly and the entire data set can be collected within a single free induction decay (FID).

Referring back to FIG. 2, a plurality of portions of the k-space are acquired by using a plurality of (e.g., three) imaging sequences. In the first set of imaging sequences, the pre-dephasing gradient pulse 240 has an initial area $A_1$, a first portion of the k-space is obtained by using the first set of imaging sequences to obtain a first k-space data set. An exemplary schematic diagram of a k-space data acquisition trajectory line is shown by 411 in FIG. 4, in which the data acquisition trajectory line of this EPI is shown by a solid line, namely, the first portion of the k-space. The first dashed line 412 and the second dashed line 413 indicate k-space data not acquired in this EPI, namely, a second portion and a third portion of the k-space. In the second set of imaging sequences, the standard area difference $$A_2(\text{e.g.,} \frac{2A_3}{3},$$

where $A_3$ is the area of the spike 241) is subtracted from (or may be added to) the initial area $A_1$ of the pre-dephasing gradient pulse 240. Therefore, a k-space data acquisition trajectory line corresponding to the second imaging sequence is shown by the first dashed line 412 in FIG. 4, the solid line 411 and the second dashed line 413 indicate k-space data not acquired in this EPI, where the trajectory line 412 as a whole move downward (in this acquisition) by ⅔ of the spacing between the adjacent trajectory lines as compared with 411. The k-space data acquisition trajectory line corresponding to this third imaging sequence becomes the third dashed line 413 in FIG. 4, where as compared with 412 in FIG. 4, the trajectory line as a whole moves downward again (in this acquisition) by ⅔ of the spacing between the adjacent trajectory lines.

In order to improve an existing MUSE acquisition method (for example, moving by ⅓ of the spacing between adjacent trajectory lines each time), the starting positions of the trajectory lines 411 and 413 in space can be kept unchanged, and only the starting position of the trajectory line 412 is moved backward by three small cells from the starting position of the trajectory line 411, namely, ⅔ of the spacing between the adjacent trajectory lines (in this acquisition).

Image reconstruction and processing are performed on the basis of these k-space data, respectively, which can effectively suppress Nyquist artifacts and acceleration artifacts. An appropriate number of sequence execution times and corresponding imaging sequence sets can be selected on the basis of the effects of artifact suppression.

Figure 5:
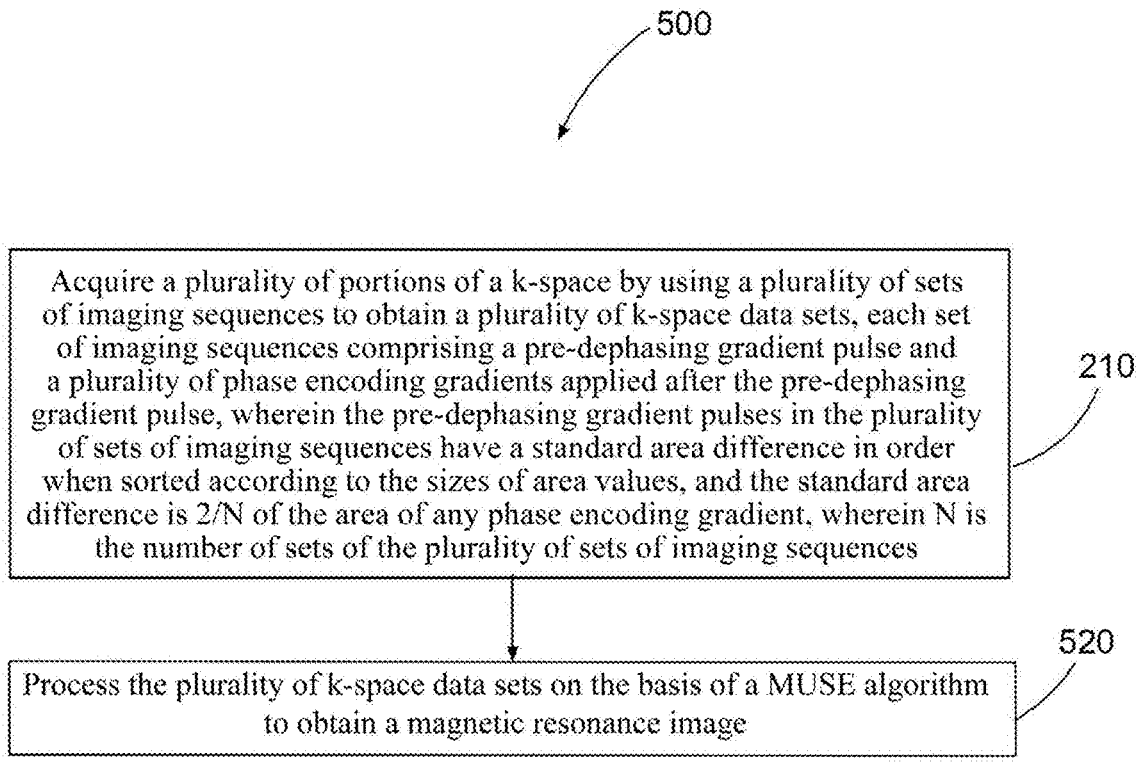
FIG. 5 is a flowchart of a magnetic resonance imaging method according to another exemplary embodiment of the present invention.

FIG. 5 shows a flowchart of a magnetic resonance imaging method according to another embodiment of the present invention, which includes steps 210 and 520. In step 520, the plurality of k-space data sets are processed on the basis of a multiplexed sensitivity-encoding (MUSE) algorithm. For a detailed description of processing of data from a plurality of scans on the basis of a MUSE algorithm, reference may be made to literature (A robust multi-shot scan strategy for high-resolution diffusion weighted MRI enabled by multiplexed sensitivity-encoding (MUSE), authors: Nan-kuei Chen, Arnaud Guidon, Hing-Chiu Chang, Allen W. Song, et al.).

Figure 6:
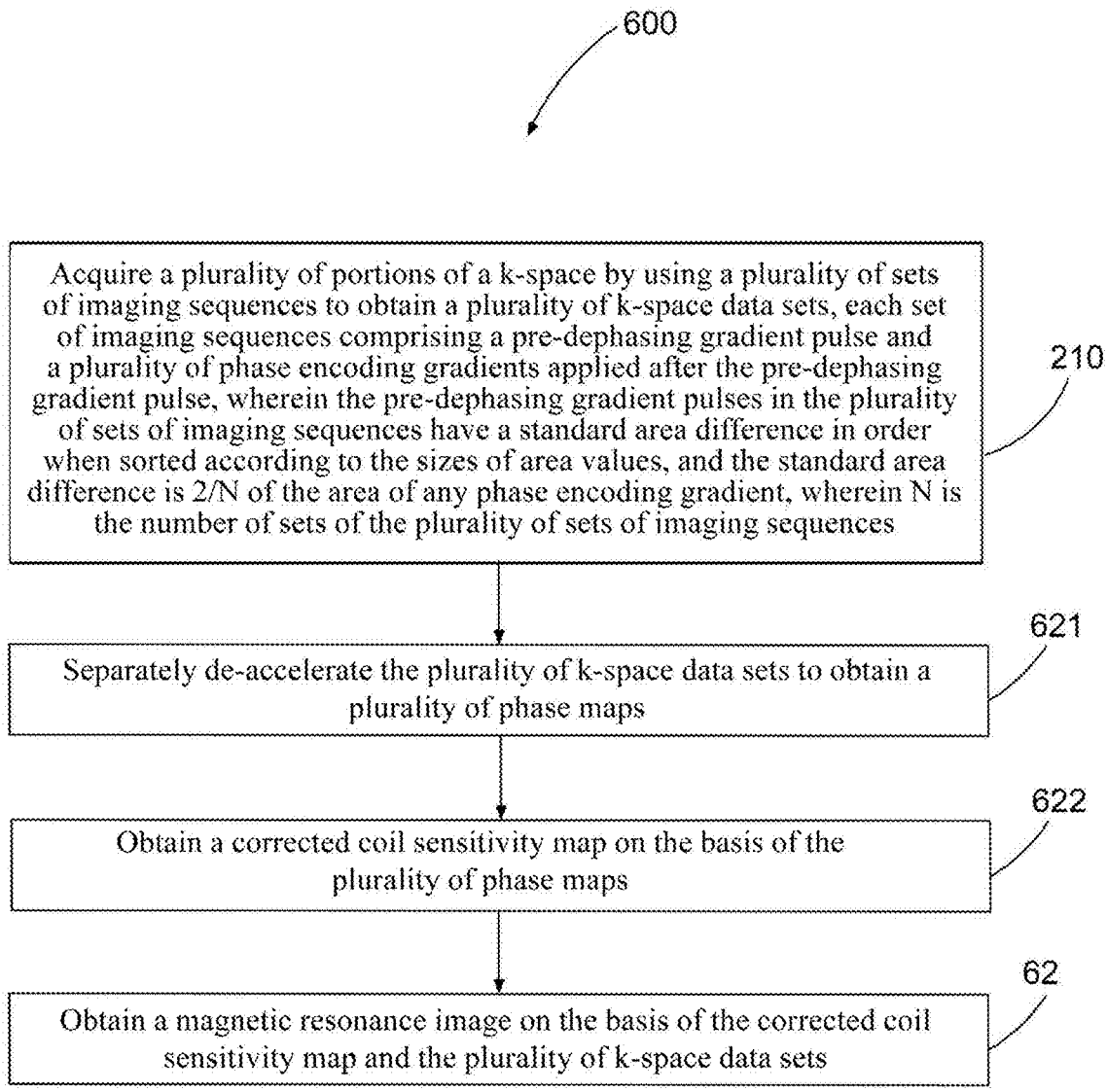
FIG. 6 is a flowchart of a magnetic resonance imaging method according to another exemplary embodiment of the present invention.

FIG. 6 shows a flowchart of a magnetic resonance imaging method according to another embodiment of the present invention, which includes steps 210 and 621-613.

In step 621, a plurality of k-space data sets are de-accelerated (or unwrapped) respectively to obtain a plurality of phase maps. In one embodiment, each k-space data set may be pre-processed (e.g., k-space data padding), and each pre-processed k-space data set is de-accelerated (e.g., by using an existing algorithm for de-accelerating artifacts) on the basis of a system-preset coil sensitivity map to obtain de-accelerated or de-warped (aliased) images, and obtain a phase map for each de-accelerated or de-warped (aliased) image. The system-preset coil sensitivity map may have fewer channels, for example, 8 channels.

In step 622, a corrected (or new) coil sensitivity map is obtained on the basis of the plurality of phase maps. When N acquisitions are performed by the method of the embodiments of the present invention to obtain N k-space data sets, the corrected coil sensitivity map may have more channels, for example, N*8 channels.

In step 623, a magnetic resonance image is obtained on the basis of the corrected coil sensitivity map and the plurality of k-space data sets, where the k-space data set for each channel of each acquisition may be de-accelerated or de-warped using the corrected coil sensitivity map, to obtain MR.

Figure 7:
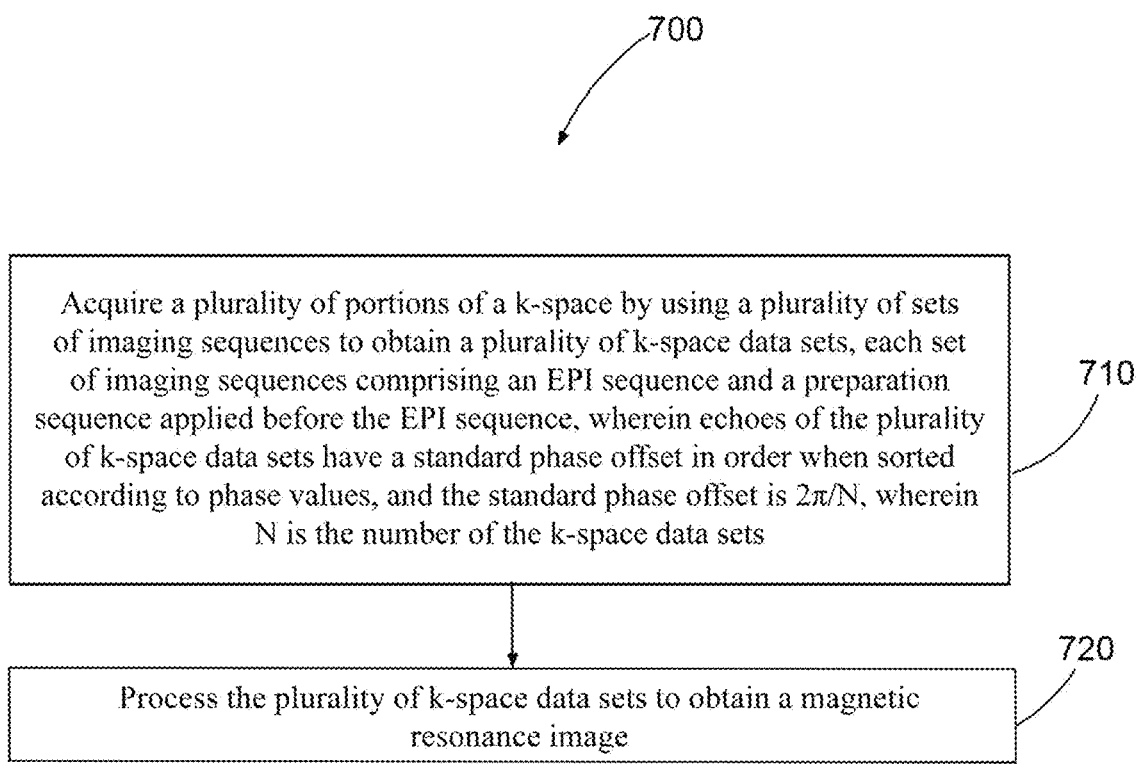
FIG. 7 is a flowchart of a magnetic resonance imaging method according to another exemplary embodiment of the present invention.

Referring to FIG. 7, a flowchart 700 of a magnetic resonance imaging method according to another exemplary embodiment of the present invention is shown. The method may be performed by an MRI system (e.g., the MRI system 100 in FIG. 1). In step 710, a plurality of portions of a k-space are acquired by using a plurality of sets of magnetic resonance imaging sequences respectively, to obtain a plurality of k-space data sets. Each set of imaging sequences includes an echo planar imaging (EPI) sequence and a preparation sequence applied before the EPI sequence. Echoes of the plurality of k-space data sets have a standard phase offset in order when sorted according to phase values, for example, the plurality of k-space data sets may be similar to the data sets shown in FIG. 3.

The preparation sequence may be similar to the preparation sequence shown in FIG. 2, for example, may include a pair of diffusion gradient pulses symmetrical to radio-frequency refocusing pulses, and the diffusion gradient pulses include a phase shifting gradient pulse and a re-phasing gradient pulse. The phase shifting gradient pulse introduces a phase shift into protons according to the positions of the protons, and the re-phasing gradient pulse reverses the change made by the phase shifting gradient pulse. The phase of fixed spins is not affected by the diffusion gradient pulse, since any phase accumulation from the phase shifting gradient pulse will be inverted by the re-phasing gradient pulse. If the protons move, the re-phasing gradient pulse will not completely undo the phase shift caused by the phase shifting gradient pulses, and there will be signal attenuation. The degree of diffusion weighting can be controlled by adjusting the configuration of diffusion gradients (e.g., intensity, duration, and spacing). The preparation sequence may also have other variants, for example, sequences such as GRE, SE, DWI alone or any combinations thereof can also be used as the preparation sequence.

A read sequence after the preparation sequence may include an EPI sequence. In the EPI sequence, after pre-dispersing the phase gradients, there is a smaller phase-encoding gradient pulse, such as the "spike" described above, at each position where the frequency-encoding gradient pulse is inverted. The spikes are of a constant size, and each adds further phase encoding to previous spikes, forming a regular path in the k-space. According to the k-space data acquisition, even-numbered echoes are in an opposite direction from odd-numbered echoes. For example, if an odd echo (or line) is in a positive direction, then an even echo (or line) is in an opposite direction, vice versa.

Between a plurality of acquisitions, odd and even echoes in one set have a standard phase offset relative to the other set. In one embodiment, the standard phase offset is $2\pi/N$, where N is the number of k-space data sets, and N may be greater than 2. Using the acquisition of five sets of k-space data described above as an example, in the first k-space data set, the k-space data acquisition trajectory line has an initial phase, whereas in the second k-space data set, the trajectory line moves as a whole by ⅖ of spacing between odd and even trajectory lines, that is, the phase is shifted by $$\frac{2\pi}{5}.$$

In the third k-space data set, the trajectory line as a whole moves again by ⅖ of the spacing between the odd and even trajectory lines, and the phase is shifted by $$\frac{4\pi}{5}$$

compared to the initial phase, and so on; in the fourth k-space data set, the phase is shifted by $$\frac{6\pi}{5}$$

from the initial phase, and in the fifth k-space data set, the phase is shifted by $$\frac{8\pi}{5}$$

from the initial phase.

In step 720, after the plurality of k-space data sets are acquired according to the plurality of sets of imaging sequences, an MR image is obtained on the basis of the plurality of k-space data sets, for example, the plurality k-space data sets may be reconstructed and processed to obtain a magnetic resonance image that simultaneously suppresses parallel acceleration artifacts and Nyquist artifacts. In some embodiments, the reconstruction includes a Fourier transform from the k-space to an image space, as known in the art.

Step 720 may be similar to the above steps 520 and 620, and details are not repeated herein.

Figure 8:
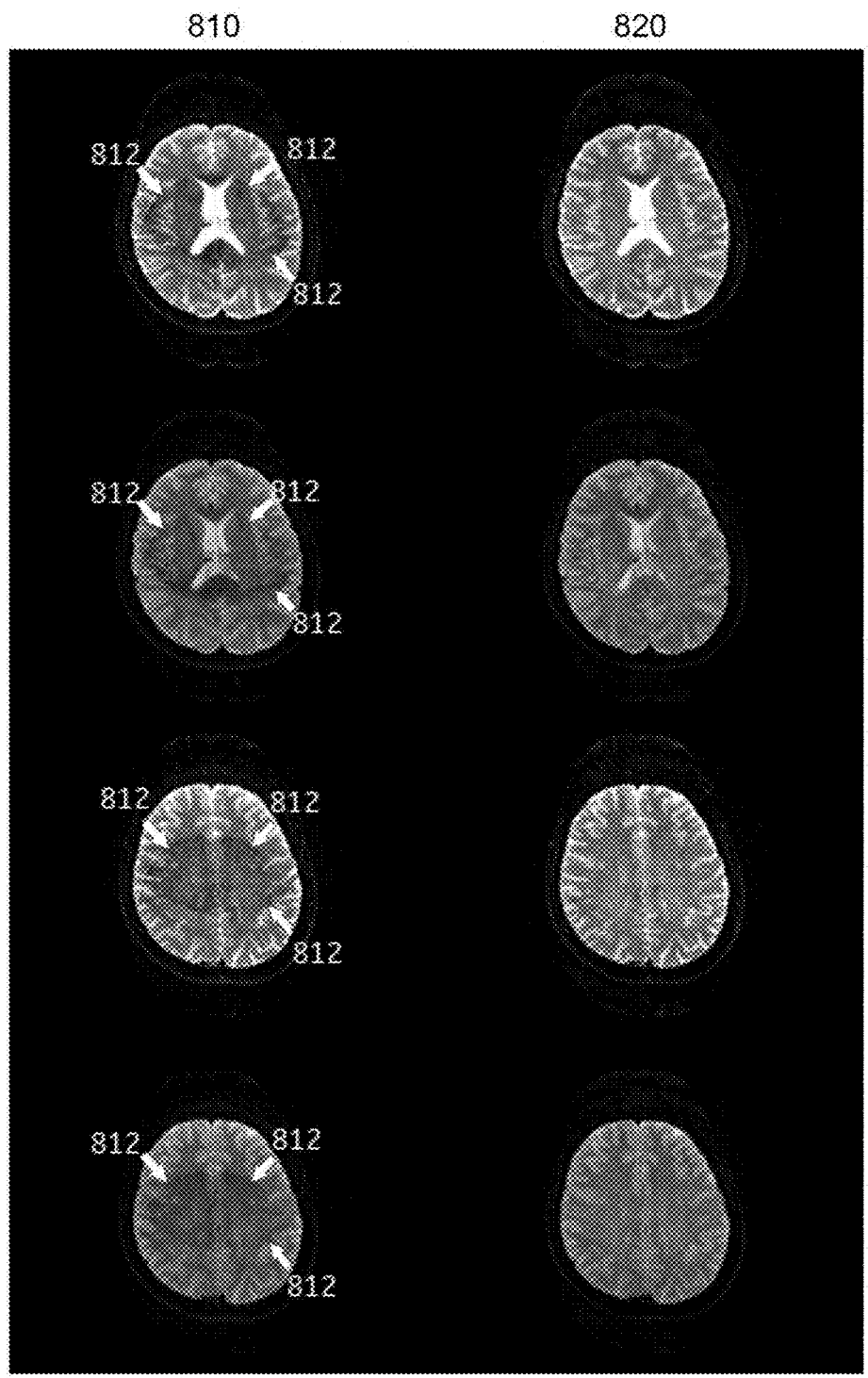
FIG. 8 is comparison of images obtained by a method according to an exemplary embodiment of the present invention and images obtained by a conventional method.

Referring to FIG. 8, according to an exemplary embodiment, images obtained by the method disclosed herein are compared to images obtained by a conventional multi-shot EPI method. Images 810 are acquired using the conventional EPI method, in which, however, Nyquist ghosting 812 is clearly visible in the images. As a comparison, images 820 are acquired using the method of the embodiments of the present invention, in which both Nyquist ghosting and acceleration artifacts are effectively suppressed.

Embodiments of the present invention may further provide a computer-readable storage medium including a stored computer program, where the magnetic resonance imaging method in any of the above embodiments is executed when the computer program is run.

Based on the above description, an exemplary embodiment of the present invention may further provide a magnetic resonance imaging (MRI) system, including: a gradient coil, configured to generate an encoding gradient; a radio-frequency (RF) coil, configured to generate an RF pulse; and a processor, connected to the gradient coil and the RF coil. The processor is configured to perform the magnetic resonance imaging method in any one of the above embodiments. For example, the processor is configured to instruct the gradient coil and the RF coil to generate a plurality of sets of imaging sequences to acquire a plurality of portions of a k-space to obtain a plurality of k-space data sets, and process the plurality of k-space data sets to obtain a magnetic resonance image. Each of the plurality of sets of imaging sequences includes a pre-dephasing gradient pulse and a plurality of phase encoding gradients applied after the pre-dephasing gradient pulse, where the pre-dephasing gradient pulses in the plurality of sets of imaging sequences has a standard area difference in order when sorted according to the sizes of area values. The standard area difference is 2/N of the area of any phase encoding gradient, where N is the number of sets of the plurality of sets of imaging sequences.

In addition to any previously indicated modifications, numerous other modifications and alternative arrangements can be devised by those skilled in the art without departing from the spirit and scope of this description, and the appended claims are intended to cover such modifications and arrangements. Thus, although information has been described in detail above in connection with what is presently believed to be the most practical and preferred aspects, it will be apparent to those of ordinary skill in the art that, without departing from the principles and concepts set forth herein, many modifications are possible, including but not limited to forms, functions, modes of operation, and uses. Also, as used herein, the examples and embodiments are intended in all respects to be illustrative only and should not be construed as limiting in any way.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A for generating an image of an object with a magnetic resonance imaging (MRI) system, the method comprising:
    acquiring by the MRI system a plurality of portions of a k-space by using a plurality of sets of imaging sequences to obtain a plurality of k-space data sets, each set of imaging sequences comprising a pre-dephasing gradient pulse and a plurality of phase encoding gradients applied after the pre-dephasing gradient pulse, wherein the pre-dephasing gradient pulses in the plurality of sets of imaging sequences have a standard area difference in order when sorted according to the sizes of area values, and the standard area difference is 2/N of the area of any phase encoding gradient, where N is the number of sets of the plurality of sets of imaging sequences;

processing by the MRI system the plurality of k-space data sets to obtain the image of the object; and displaying the image of the object on a display.

2. A for generating an image of an object with a magnetic resonance imaging (MRI) system, the method comprising:

acquiring by the MRI system a plurality of portions of a k-space by using a plurality of sets of imaging sequences to obtain a plurality of k-space data sets, each set of imaging sequences comprising an echo-planar imaging sequence and a preparation sequence applied before the echo-planar imaging sequence, wherein echoes of the plurality of k-space data sets have a standard phase offset in order when sorted according to phase values, and the standard phase offset is $2\pi/N$, where N is the number of the k-space data sets;

processing by the MRI system the plurality of k-space data sets to obtain the image of the object; and displaying the image of the object on a display.

3. A magnetic resonance imaging (MRI) system, comprising:

a gradient coil, configured to generate an encoding gradient;

a radio-frequency (RF) coil, configured to generate an RF pulse; and a processor connected to the gradient coil and the RF coil, configured to:

instruct the gradient coil and the RF coil to generate a plurality of sets of imaging sequences to acquire a plurality of portions of a k-space and obtain a plurality of k-space data sets, each set of imaging sequences comprising a pre-dephasing gradient pulse and a plurality of phase encoding gradients applied after the pre-dephasing gradient pulse, wherein the pre-dephasing gradient pulses in the plurality of sets of imaging sequences have a standard area difference in order when sorted according to the sizes of area values, and the standard area difference is 2/N of the area of any phase encoding gradient, where N is the number of sets of the plurality of sets of imaging sequences;

obtain a magnetic resonance image on the basis of the plurality of k-space data sets; and display the magnetic resonance image on a display.

4. The method according to claim 1, wherein the number of sets of the plurality of sets of imaging sequences is greater than two.

5. The method according to claim 1, wherein the step of processing the plurality of k-space data sets comprises: processing the plurality of k-space data sets on the basis of a multiplexed sensitivity encoding algorithm.

6. The method according to claim 1, wherein the step of processing the plurality of k-space data sets comprises:

separately de-accelerating the plurality of k-space data sets to obtain a plurality of phase maps;

obtaining a corrected coil sensitivity map on the basis of the plurality of phase maps; and obtaining the image of the object on the basis of the corrected coil sensitivity map and the plurality of k-space data sets.

7. The method according to claim 1, wherein each set of imaging sequences further comprises a radio-frequency excitation pulse, a radio-frequency refocusing pulse, and a diffusion gradient pulse, the diffusion gradient pulse comprises a phase shifting gradient pulse and a re-phasing gradient pulse, the phase shifting gradient pulse and the re-phasing gradient pulse are applied symmetrically before and after the radio-frequency refocusing pulse respectively, and the pre-dephasing gradient pulse is applied after the re-phasing gradient pulse.

8. The method according to claim 2, wherein the number of the k-space data sets is greater than two.

9. The method according to claim 2, wherein the preparation sequence comprises a spin echo sequence, a gradient echo sequence, a diffusion weighting sequence, or a spin echo-diffusion weighting sequence.

10. A non-transitory computer-readable storage medium, comprising a stored computer program, wherein the magnetic resonance imaging method according to claim 1 is performed when the computer program is run.

11. The system according to claim 3, wherein echoes of the plurality of k-space data sets have a standard phase offset in order when sorted according to phase values, and the standard phase offset is $2\pi/N$, where N is the number of the k-space data sets.

* * * * *